US011353927B2

(12) United States Patent
Yu et al.

(10) Patent No.: US 11,353,927 B2
(45) Date of Patent: Jun. 7, 2022

(54) BENDABLE DEVICE

(71) Applicant: SHENZHEN ROYOLE TECHNOLOGIES CO., LTD., Guangdong (CN)

(72) Inventors: Hualing Yu, Guangdong (CN); Songya Chen, Guangdong (CN); Xiaofei Fan, Guangdong (CN); Shuo Ouyang, Guangdong (CN); Tingguang Ya, Guangdong (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 52 days.

(21) Appl. No.: 17/076,423

(22) Filed: Oct. 21, 2020

(65) Prior Publication Data

US 2021/0116969 A1   Apr. 22, 2021

(30) Foreign Application Priority Data

Oct. 21, 2019 (CN) .......................... 201911002271.X

(51) Int. Cl.
| | |
|---|---|
| *G06F 1/16* | (2006.01) |
| *H05K 5/02* | (2006.01) |
| *H05K 5/00* | (2006.01) |
| *H01L 51/52* | (2006.01) |
| *H01L 51/00* | (2006.01) |

(52) U.S. Cl.
CPC .......... *G06F 1/1652* (2013.01); *G06F 1/1681* (2013.01); *H01L 51/0097* (2013.01); *H01L 51/5237* (2013.01); *H05K 5/0017* (2013.01); *H05K 5/0226* (2013.01); *H01L 2251/5338* (2013.01)

(58) Field of Classification Search
CPC .... G06F 1/1652; G06F 1/1681; G06F 1/1637; G06F 1/1641; H01L 51/0097; H01L 51/5237; H01L 2251/5338; H05K 5/0017; H05K 5/0226; Y02E 10/549; G09F 9/301
See application file for complete search history.

(56) References Cited

U.S. PATENT DOCUMENTS

| | | | | |
|---|---|---|---|---|
| 9,874,906 | B1 * | 1/2018 | Hsu ....................... | G06F 1/1641 |
| 10,558,242 | B2 * | 2/2020 | Kim ...................... | G06F 1/1681 |
| 10,623,537 | B2 * | 4/2020 | Lee ....................... | G06F 1/1681 |
| 10,659,576 | B1 * | 5/2020 | Hsu ...................... | H04M 1/0268 |
| 10,993,338 | B2 * | 4/2021 | Cha ....................... | H05K 5/0226 |
| 11,023,009 | B2 * | 6/2021 | Kim ...................... | G06F 1/1641 |
| 2017/0010634 | A1 * | 1/2017 | Ahn ...................... | G06F 1/1652 |
| 2018/0070460 | A1 * | 3/2018 | Han ...................... | G06F 1/1626 |
| 2020/0029449 | A1 * | 1/2020 | Makinen ............... | G06F 1/1652 |
| 2020/0253069 | A1 * | 8/2020 | Cha ....................... | G06F 1/1681 |

* cited by examiner

*Primary Examiner* — Abhishek M Rathod
(74) *Attorney, Agent, or Firm* — Hauptman Ham, LLP

(57) ABSTRACT

A bendable device is provided according to the present disclosure. The bendable device includes a bendable flexible screen, a supporting sheet assembly, and a housing assembly. The flexible screen includes a display surface and a rear surface opposite to the display surface. The supporting sheet assembly is sandwiched between the rear surface of the flexible screen and the housing assembly. The flexible screen is connected to the housing assembly via the supporting sheet assembly. The flexible screen is connected to the supporting sheet assembly, such that when disassembling the bendable device, only the supporting sheet assembly needs to be disassembled from the housing, thereby improving reliability of disassembly.

18 Claims, 8 Drawing Sheets

BENDABLE DEVICE

CROSS-REFERENCE TO RELATED APPLICATION(S)

This application claims priority to Chinese Patent Application Serial No. 201911002271.X, filed on Oct. 21, 2019, the entire disclosures of which are hereby incorporated by reference.

TECHNICAL FIELD

This disclosure relates to the technical field of electronic devices, and in particular to a bendable device.

BACKGROUND

Existing mobile terminals, such as mobile phones, tablets, etc., are all made to have a flat structure due to material of screens. With continuous development of screen technology, bendable flexible screens have emerged.

When disassembling an existing bendable device, the flexible screen is usually damaged.

SUMMARY

A bendable device is provided according to the present disclosure.

A bendable device is provided according to the present disclosure. The bendable device includes a bendable flexible screen, a supporting sheet assembly, and a housing assembly. The flexible screen includes a display surface and a rear surface opposite to the display surface. The supporting sheet assembly is sandwiched between the rear surface of the flexible screen and the housing assembly. The flexible screen is connected to the housing assembly via the supporting sheet assembly.

In an implementation, the supporting sheet assembly includes a first sheet and a second sheet adjacent to the first sheet. The first sheet is rigid or bendable, the second sheet is flexible, and a portion of the flexible screen aligned with the second sheet is bendable.

In an implementation, the housing assembly includes a first housing, a second housing, and a bendable member connected between the first housing and the second housing. The first sheet is detachably connected to one of the first housing and the second housing. The second sheet is detachably connected to the bendable member.

In an implementation, the first sheet is connected to one of the first housing and the second housing via screws.

In an implementation, the second sheet is connected to the bendable member via screws.

In an implementation, the second sheet includes a middle section and two ends respectively disposed at two opposite sides of the middle section. The two ends are respectively close to edges of the second sheet, and multiple first stud portions protrude from a side of the middle section facing the bendable member. The bendable member defines multiple stud grooves aligned with the multiple first stud portions. The multiple first stud portions are respectively received in the multiple stud grooves. At least one of the two ends of the second sheet is detachably connected with an end of the bendable member.

In an implementation, each of the multiple first stud portions includes a first fixed stud corresponding to a central position of the bendable member and two first sliding studs respectively disposed at two sides of the first fixed stud. Each of the multiple stud groove portions includes a first stud groove disposed at the central positon of the bendable member and two second stud grooves respectively disposed at two sides of the first stud groove. The first fixed stud is fixed in the first stud groove, and the first sliding stud is slidable in the second stud groove. The first stud groove matches the first fixed stud in width to enable the first fixed stud to be fixedly connected. The second stud groove has a larger width than the first sliding stud to enable the first sliding stud to be slidably connected in the second stud groove.

In an implementation, the bendable member defines at least one groove. At least one adhesive portion is disposed within the at least one groove, and the at least one adhesive portion is used to connect at least one of the two ends of the second steel sheet with the bendable member.

In an implementation, the two ends of the second sheet each define at least one hollow portion. The at least one groove is defined at positions of the bendable member aligned with the least one hollow portion. At least one adhesive portion is disposed within the at least one hollow portion, and the at least one adhesive portion is used to connect at least one of the two ends of the second steel sheet with the bendable member.

In an implementation, the bendable member includes a hinge assembly and two sliders arranged at two sides of the hinge assembly. The hinge assembly includes a first hinge unit and two second hinge units. The first hinge unit defines a first connection through hole aligned with the first fixed stud. A screw passes through the first connection through hole from a side of the first hinge unit away from the second sheet and is locked to the first stud portion. The two sliders each defines at least one groove aligned with the at least one hollow portion, such that the two sliders are fixedly connected to the two ends of the second sheet.

In an implementation, the first hinge unit defines two notches at two sides of the first hinge unit. An end of each of the two second hinge units facing the first hinge unit is received in the notch and connected to the first hinge unit via a rotatable shaft. A portion of each of the two second hinge units in one of the two notches is gradually rotated outwardly during that the bendable device switches from an unfolded state to a folded state having a first angle, such that a bent outer surface of the hinge assembly is gradually elongated. The two sliders are respectively disposed at sides of the second hinge units, and a distance between each of the two sliders and each of the two second hinge units is gradually reduced during the bendable device switches from the unfolded state to the folded state having the first angle.

In an implementation, an adhesive layer is disposed between the first sheet and the flexible screen, such that the flexible screen is bonded to the first sheets.

In an implementation, an adhesive layer is disposed between a part of the second sheet and a part of the flexible screen, such that the flexible screen is bonded to the second sheet.

In an implementation, at least one second stud protrudes from the first sheet. The first housing defines at least one second connection through hole corresponding to the at least one second stud. At least one screw passes through the at least one second connecting through hole from a side of the housing assembly away from the second sheet and is fixedly locked to the at least one second stud.

In an implementation, two rows of second studs are respectively disposed at edges of the housing assembly.

In an implementation, an adhesive layer is disposed between a part of the first sheet and one of a part of the first housing or a part of the second housing, such that the first sheet is bonded to the first housing or the second housing.

In an implementation, the adhesive layer is a double-sided adhesive layer.

The entire flexible screen is connected to the supporting sheet assembly, such that when disassembling the bendable device, only the supporting sheet assembly needs to be disassembled from a housing, thereby improving reliability of disassembly.

BRIEF DESCRIPTION OF THE DRAWINGS

To describe technical solutions in the implementations of the present disclosure more clearly, the following briefly introduces the accompanying drawings required for describing the implementations. Apparently, the accompanying drawings in the following description merely illustrate some implementations of the present disclosure. Those of ordinary skill in the art may also obtain other accompanying drawings based on these provided herein without creative efforts.

DETAILED DESCRIPTION OF ILLUSTRATED EMBODIMENTS

The above description are preferred implementations of the present disclosure. It is noted that for a person of ordinary skill in the art various improvements and modifications can be made without departing from the principle of the application, and the improvement and the modification are also considered to fall in the protection scope of the present disclosure.

Figure 1:
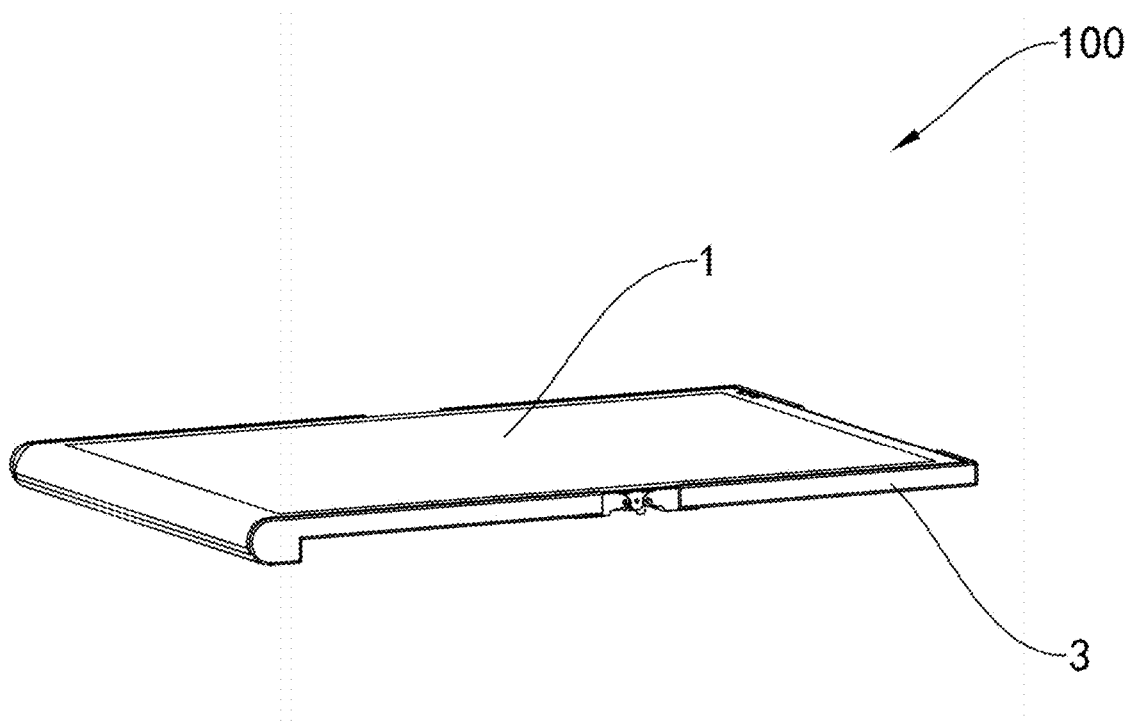
FIG. 1 is a schematic structural view of a bendable device according to an implementation of the present disclosure.
Figure 2:
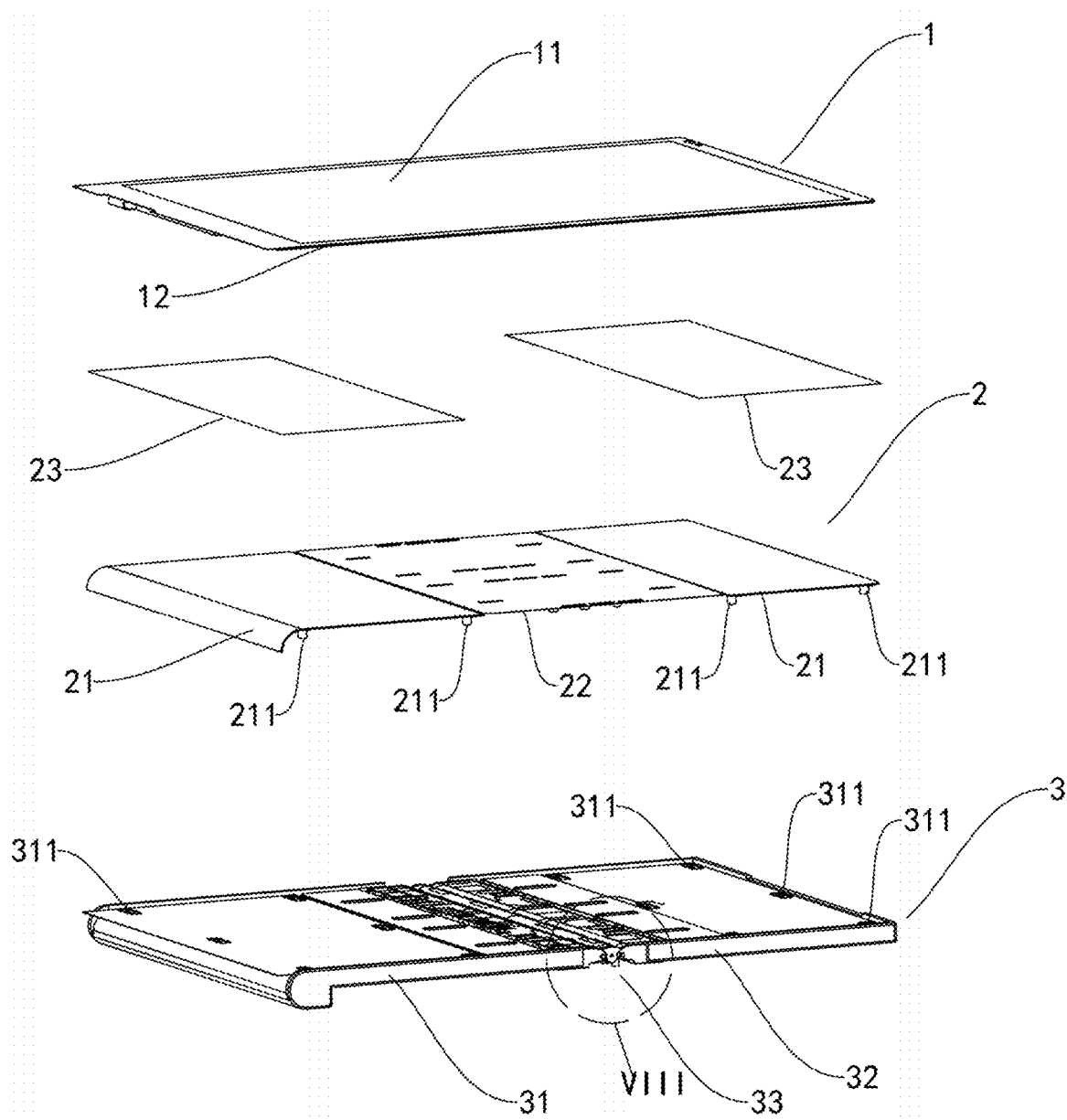
FIG. 2 is an exploded, perspective view of the bendable device illustrated in FIG. 1.

FIG. 1 is a schematic structural view of a bendable device 100 according to an implementation of the present disclosure. FIG. 2 is an exploded, perspective view of the bendable device 100 illustrated in FIG. 1. The bendable device 100 includes a bendable flexible screen 1, a supporting sheet assembly 2, and a housing assembly 3. The flexible screen 1 includes a display surface 11 and a rear surface 12 opposite to the display surface 11. The supporting sheet assembly 2 is sandwiched between the rear surface 12 of the flexible screen 1 and the housing assembly 3. The flexible screen 1 is connected to the housing assembly 3 via the supporting sheet assembly 2. As an option, the supporting sheet assembly 2 is made of steel.

The entire flexible screen 1 is connected to the supporting sheet assembly 2, such that when disassembling the bendable device 100, only the supporting sheet assembly 2 needs to be disassembled from the housing assembly 3, thereby improving reliability of disassembly.

In an implementation, as illustrated in FIG. 2, the housing assembly 3 is bendable and includes a first housing 31, a second housing 32, and a bendable member 33 connected between the first housing 31 and the second housing 32. An angle defined between the first housing 31 and the second housing 32 of the bendable device 100 is changed by bending the bendable member 33, thereby changing a shape of the bendable device 100. Of course, in other implementations, the housing assembly 3 may also include the first housing 31 and the bendable member 33 connected to an end of the first housing 31.

It is noted that, the bendable member 33 may be made of a bendable material such as a bendable elastic material (that is, the material itself is elastic, such as rubber, elastic rubber, foam, etc.), a bendable inelastic material (that is, the material itself does not have elasticity, such as a bendable metal sheet, a metal wire, a metal spring, or a plastic sheet, etc.), a bendable soft material (that is, the material itself is soft and can be bent as desired, such as cloth). The bendable member 33 may also include at least two hinges rotatably connected with each other, that is, each two adjacent hinges are rotatably connected by various limit linkage mechanisms such as shafts, gears, slide grooves, slide rails, etc., such that the entire bendable member 33 is bendable. The bendable member 33 may also include at least two gears rotatably connected with each other, or at least two connecting rods connected with each other via a flexible elastic band. The bendable member 33 may also be made from a material that may be changed in morphology due to external conditions, such as memory alloy that is bent when subjected to hear and unfolded when subjected to cold, a thermally conductive material that is softened when subjected to heat and hardened when subjected to cold, a magnetically conductive material that is hardened when subjected to magnetic induction and softened without magnetic fields, or the like. In other words, any bendable material, structure or the like can be applied to the bendable member 33 in the present disclosure.

In this implementation, the flexible screen 1 is a flexible organic light emitting diode (OLED), which has low power consumption, and is flexible. In other words, when the flexible screen 1 is mounted on a non-rigid structure, all parts of the flexible screen may be bendable.

In this implementation, as illustrated in FIG. 2, the supporting sheet assembly 2 corresponds to the housing assembly 3 in structure. It is noted that, a part of the supporting sheet assembly 2 disposed between the flexible screen 1 and the first housing 31 or disposed between the flexible screen 1 and the second housing 32 is unbendable, so as to provide support for the flexible screen 1 aligned with the part of the supporting sheet assembly 2. Alternatively, the part of the supporting sheet assembly 2 disposed between the flexible screen and the first housing or the second housing may be bendable. A part of the supporting sheet assembly 2 disposed between the bendable member 33 and the flexible screen 1 is bendable. Since the flexible screen 1 itself is bendable, the flexible screen 1 can also be bent following a bending of the supporting sheet assembly 2 and the bendable member 33 provided herein. In an implementation illustrated in FIG. 2, the supporting sheet assembly 2 includes a first sheet 21 and a second sheet 22 adjacent to the first sheet 21. The first sheet 21 includes two first sheets 21. The second sheet 22 is connected between the two first sheets 21. The two first sheets 21 are rigid or bendable, the second sheet 22 is flexible, and a portion of the flexible screen 1 aligned with the second sheet 22 is bendable. The supporting sheet assembly 2 includes the two independent first sheets 21 and one flexible second sheet 22, facilitating processing the supporting sheet assembly 2. Of course, in other implementations, the supporting sheet assembly 2 may be formed with one rigid sheet, and a portion of the supporting sheet assembly 2 aligned with the bendable member 33 is designed to be thin, such that the portion of the rigid sheet aligned with the bendable member 33 is bendable.

In an implementation, as illustrated in FIG. 2, the two first sheets 21 are respectively detachably connected to the first housing 31 and the second housing 32. The second sheet 32 is detachably connected to the bendable member 33.

The first sheet 21 and the second sheet 22 are detachably connected with the housing assembly 3, which is beneficial to disassemble and assemble the first sheet 21, the second sheet 22, and the housing assembly 3.

As illustrated in FIG. 2, an adhesive layer 23 is disposed between the first sheet 21 and the flexible screen 1, such that the flexible screen 1 is bonded to the first sheet 21. In an implementation, the flexible screen 1 and the first sheet 21 are directly bonded together via the adhesive layer 23. In this way, when disassembling the bendable device 100, it is only necessary to disassemble the first sheet 21 from the housing assembly 3 to avoid damage to the flexible screen 1. In an implementation, the adhesive layer 23 may be a double-sided adhesive layer. Of course, in other implementations, the adhesive layer 23 may also be liquid glue, etc.

In an implementation, an adhesive layer is disposed between a part of the second sheet 22 and a part of the flexible screen 1, such that the flexible screen 1 is partially bonded to the second sheet 22. In other words, other parts of the second sheet 22 are not bonded to the flexible screen 1. Therefore, when the flexible screen 1 is bent with the second sheet 22, the partial bonding between the flexible screen 1 and the second sheet 22 may facilitate sliding of the flexible screen 1 relative to the second sheet 22.

Figure 3:
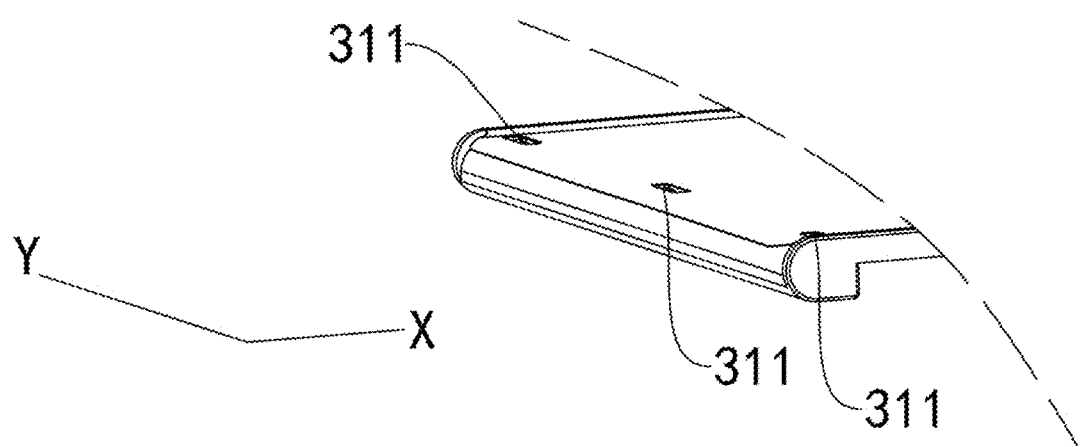
FIG. 3 is a partial, perspective view of a housing assembly illustrated in FIG. 2.

In an implementation as illustrated in FIG. 2, the two first sheets 21 are respectively connected to the first housing 31 and the second housing 32 via screws. As an example, as illustrated in FIG. 2 and FIG. 3, the two first sheets 21 each are provide with at least one second stud 211. The first housing 31 and the second housing 32 each define at least one second connection through hole 311 corresponding to the at least one second stud 211. A screw passes through one second connecting through hole 311 from a side of the housing assembly 3 away from the second sheet 22 and is fixedly locked to one second stud 211. In an implementation, two rows of second studs 211 are disposed at edges of the housing assembly 3. In an implementation, two second studs 211 form one row. The two rows of second studs 211 respectively protrude from ends of the first sheet 21 along a second direction X. Therefore, it is possible to firmly connect the first sheet 21 to the first housing 31 and the second housing 32, thereby avoiding warping of the ends of the first sheet 21 and further improving reliability of the bendable device 100. By means of cooperation between the studs 211 on the first sheet 21 and the screws, the first sheet 21 can be detachably connected to the first housing 31 and the second housing 32, which is beneficial for processing and assembly. Of course, in other implementations, the first sheet 21 may also be detachably connected to the first housing 31 and the second housing 32 via a snap connection or a magnetic connection.

Furthermore, as illustrated in FIG. 2, an adhesive layer is disposed between a part of the first sheet 21 and a part of the first housing 31 or disposed between a part of the first sheet 21 and a part of the second housing 32, such that the first sheet 21 is partially bonded to the first housing 31 or the second housing 32. As an example, the adhesive layer may be a double-sided adhesive layer. The double-sided adhesive layer is attached between the first sheet 21 and the first housing 31, and between the first sheet 21 and the second housing 32, thereby further enhancing connection strength among the first sheet 21 and the first housing 31 and the second housing 32.

Figure 4:
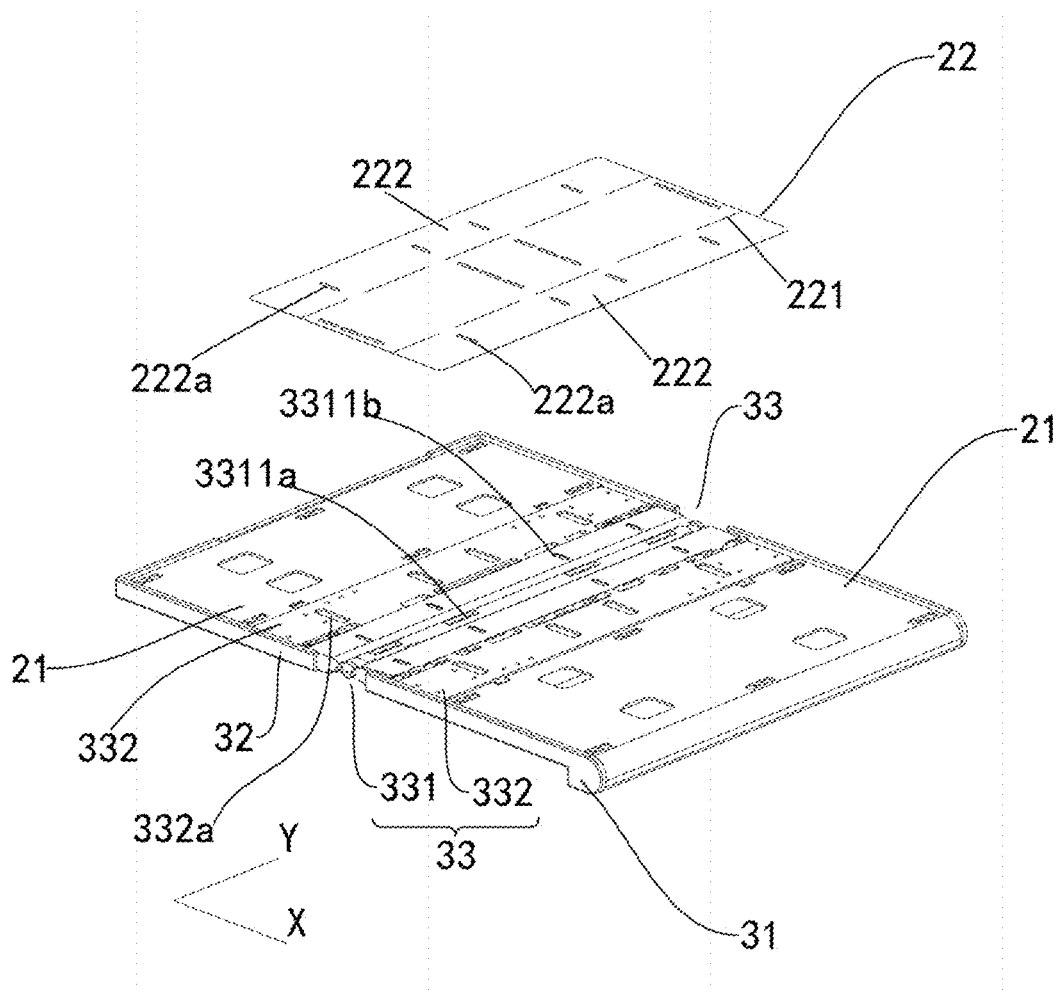
FIG. 4 is an exploded, perspective view of the bendable device illustrated in FIG. 2, viewed from another viewpoint.
Figure 5:
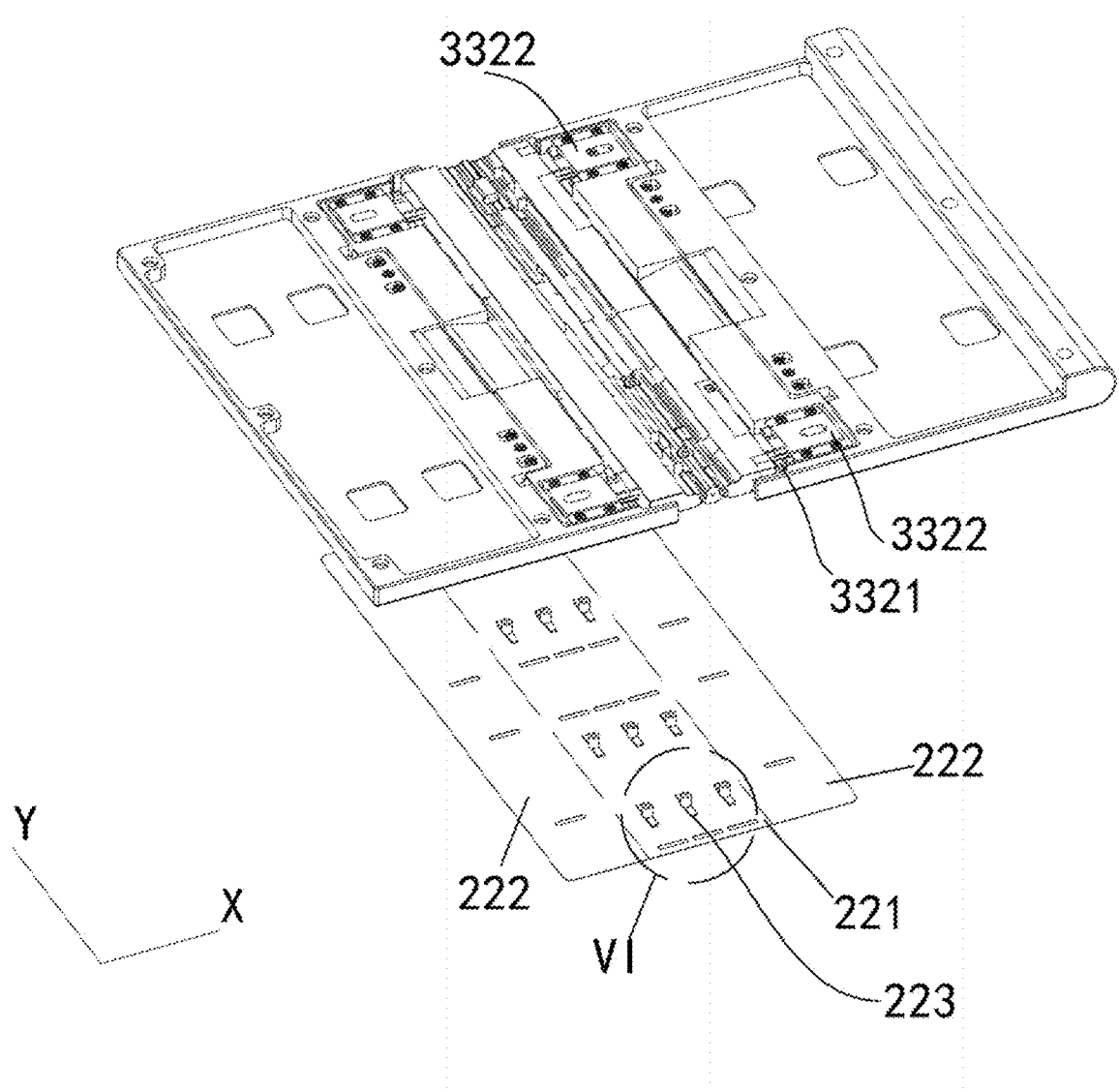
FIG. 5 is an exploded, perspective view of the bendable device illustrated in FIG. 4, viewed from yet another viewpoint.
Figure 6:
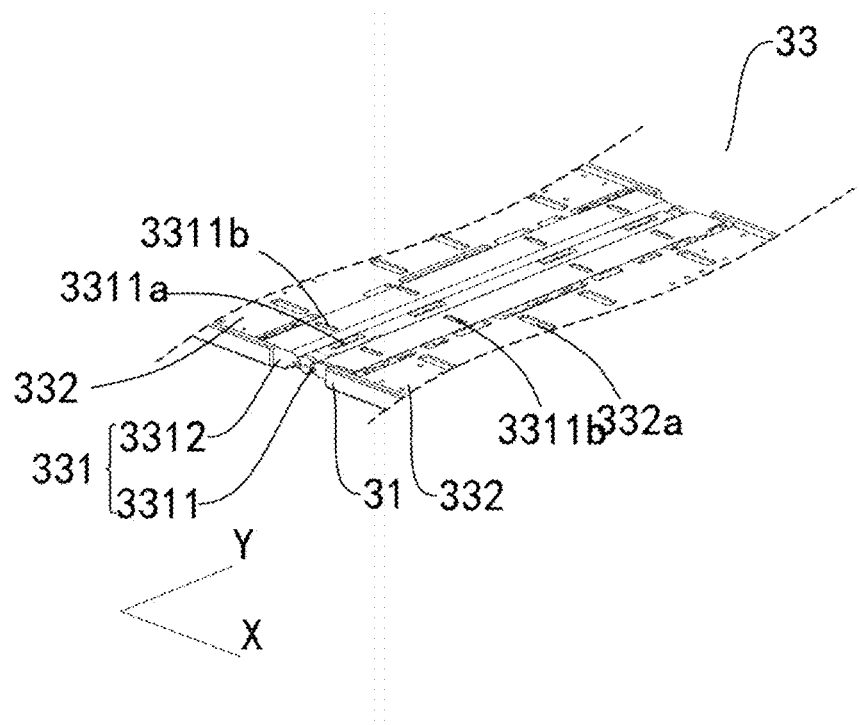
FIG. 6 is a partial, perspective view of the bendable device illustrated in FIG. 4.

In an implementation as illustrated in FIGS. 4 to 6, the second sheet 22 is connected to the bendable member 33 via screws. As an example, the second sheet 22 includes a middle section 221 and two ends 222 respectively disposed at two opposite sides of the middle section 221. The two ends 222 are respectively close to edges of the second sheet 22. Multiple first stud portions 223 protrude from a side of the middle section 221 facing the bendable member 33. The bendable member 33 defines multiple stud groove portions aligned with the multiple first stud portions 223. The multiple first portions 223 are respectively received in the multiple stud groove portions. The middle section 221 of the second sheet 22 is detachably connected to a middle position of the bendable member 33, at least one of the two ends 222 of the second sheet 22 is detachably connected to an end of the bendable member 33, such that a bent side of the bendable member 33 matches the second sheet 22 in length, thereby preventing the flexible screen from being stretched or contracted which may damage the flexible screen 1.

Figure 7:
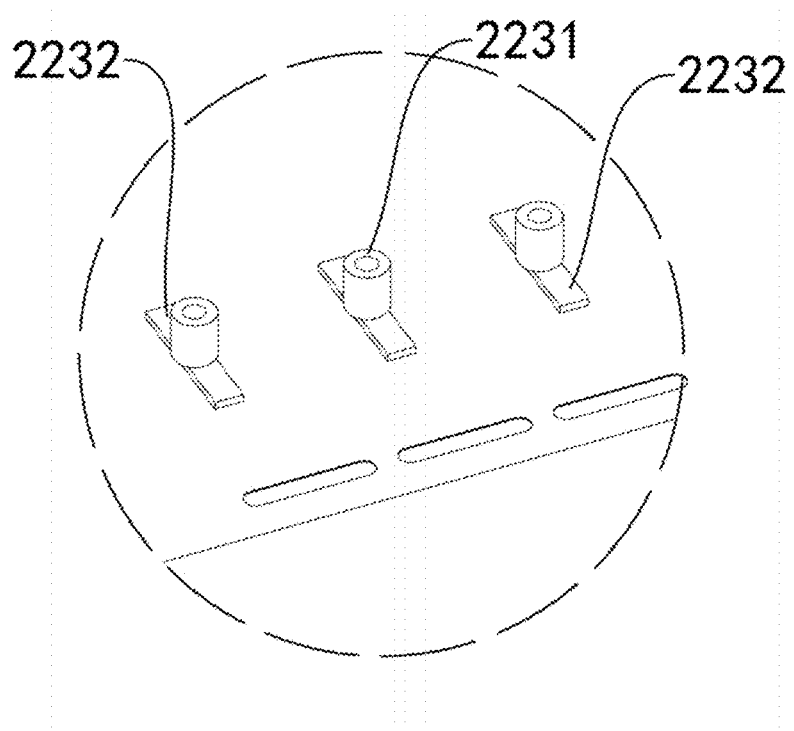
FIG. 7 is a partial, perspective view of a portion VI of the bendable device illustrated in FIG. 5.

In an implementation, as illustrated in FIG. 7, each first stud portion 223 includes a first fixed stud 2231 corresponding to a central position of the bendable member 33 and two first sliding studs 2232 respectively disposed at two sides of the first fixed stud 2231. In an implementation, three rows of stud portions 223, side by side, protrude from the middle section 221 of the second sheet 22 along the second direction X. The three rows of stud portions 223 include one row of first fixed studs 2231 and two rows of first sliding studs 2232 respectively disposed at two sides of the row of first fixed studs 2231. Each row of first stud portions 223 includes four studs spaced apart from each other along a first direction Y. In an implementation, the first fixed stud 2231 and the first sliding stud 2232 may be the same in structure, and each have a strip protrusion and a columnar protrusion protruding from the strip protrusion. Correspondingly, as illustrated in FIG. 6, the stud groove portions on the bendable member 33 for engaging with the first stud portions 223 are the same in number and arrangement as the first stud portions 223. Each stud groove portion includes a first stud groove 3311*a* disposed at the central positon of the bendable member 33 and two second stud grooves 3311*b* respectively disposed at two sides of the first stud groove 3311*a*, where the first fixed stud 2231 is fixed in the first stud groove 3311*a*, and the first sliding stud 2232 is slidable in the second stud groove 3311*b*. The first stud groove 3311*a* matches the first fixed stud 2231 in width, such that the first fixed stud 2231 can be fixed in the first stud groove 3311*a*. The second stud groove 3311*b* has a larger width than the first sliding stud 2232 and extends along the second direction X, such that the first sliding stud 2232 is slidable in the second stud groove 3311 along the second direction X.

Figure 6A:
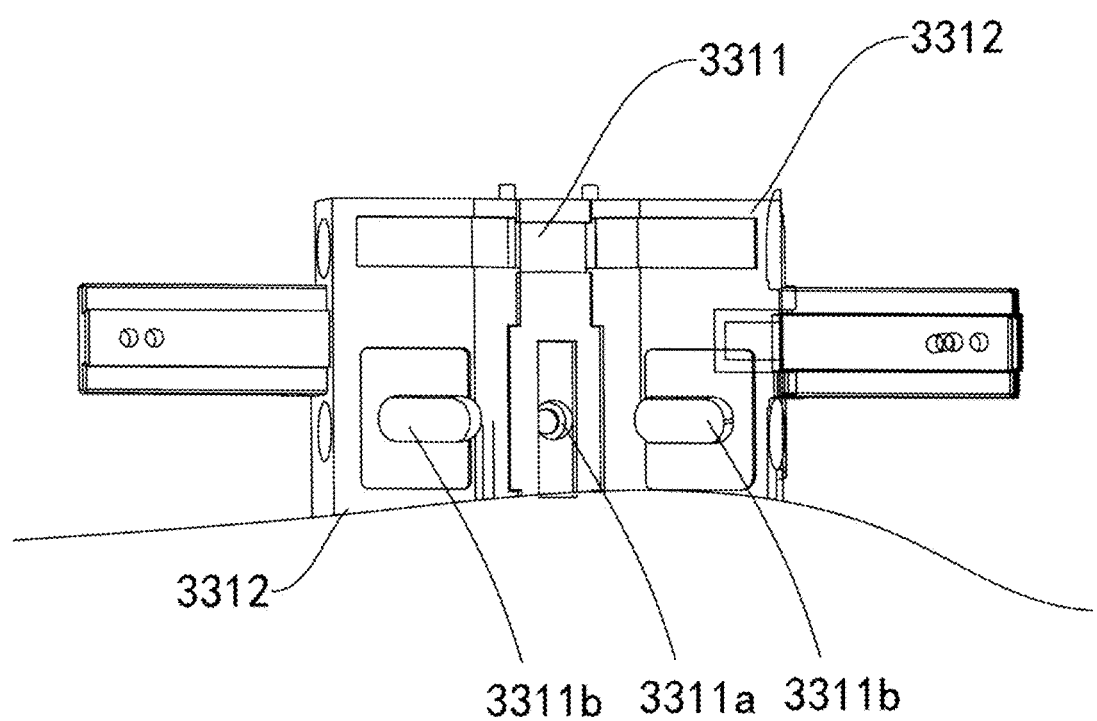
FIG. 6a is a partial, perspective view of a hinge assembly of the bendable device illustrated in FIG. 6.

In an implementation, as illustrate in FIG. 6, the bendable member 33 includes a hinge assembly 331 and two sliders 332 respectively arranged at two sides of the hinge assembly 331. The hinge assembly 331 includes a first hinge unit 3311 and two second hinge units 3312. The first housing 31 and the second housing 32 are respectively fixedly connected with the two second hinge units 3312. One of the two sliders 332 is disposed between the first housing 31 and one of the two second hinge units 3312 and slidably connected to the one of the two second hinge units 3312, and the other of the two sliders 332 is disposed between the second housing 32 and the other of the two second hinge units 3312 and slidably connected to the other of the two second hinge units 3312. In an implementation, referring to FIG. 6a, the bendable member 33 is provided with the first hinge unit 3311 at the middle position of the bendable member 33. In other words, the first hinge unit 3311 defines one row of first stud grooves 3311a, aligned with the first stud portions 223, on a surface of the first hinge unit 3311 facing the second sheet 22. The two second hinge units 3312 respectively disposed at the two sides of the first hinge unit 3311 each define one row of second stud grooves 3311b. Accordingly, by means of cooperation between the three rows of studs on the second sheet 22 (that is, one row of first fixed studs 2231 and two rows of second sliding studs 2232 respectively arranged at two sides of the row of first fixed studs 2231) and three rows of stud grooves defined in the hinge assembly 331 (that is, one row of first stud grooves 3311a and two rows of second stud grooves 3311b respectively arranged at two sides of the row of first stud grooves 3311a), the middle section 221 of the second sheet 22 is fixedly connected to the hinge assembly 331. In other words, a central line of the middle section 221 of the second sheet 22 where the first fixed studs 2231 are arranged, is stationary relative to the first hinge unit 3311 of the hinge assembly 331. The two ends 222 of the second sheet 22 may correspond to the two sliders 332, that is, each end 222 of the second sheet 22 is fixedly connected to one slider 332. In this way, when bending the second sheet 22 and the bendable member 33, the two sliders 332 can be driven to slide in a direction toward or away from the first hinge unit 3311 by the two ends 222 of the second sheet 22. In other words, the bent side of the bendable member 33 matches the second sheet 22 in length, thereby preventing the flexible screen 1 from being stretched or contracted.

The first hinge unit 3311 defines first connection through holes aligned with the first fixed studs 2231. A screw passes through the first connection through hole from a side of the first hinge unit 3311 away from the second sheet 22 and is locked to the first stud portion 223.

In an implementation, as illustrated in FIG. 5, the two sliders 332 each include a main body 3321 and two fixing bases 3322 disposed at the main body 3321. The main body 3321 is substantially rectangular. The main body 3321 includes a first surface and a second surface opposite to the first surface. The first surface is close to the flexible screen 1. The second surface faces away from the flexible screen 1. The two fixing bases 3322 are respectively arranged along the first direction Y and close to ends of the main body 3321. The two fixing bases 3322 each define an inner cavity, and an extension portion of one second hinge unit 3312 extends into the inner cavity of the fixing base 3322 of the main body 3321. The main body 3321 is slidable relative to the second hinge unit 3312, such that the bent side of the bendable member 33 matches the flexible screen 1 in length, thereby preventing the flexible screen 1 from being stretched or contracted. The slider 332 can ensure smooth relative sliding between the slider 332 and the second hinge unit 3312, thereby further improving the reliability of the bendable device 100. Of course, in other implementations, the structure of the slider 332 may be the same as that of the fixing base 3322. The two fixing bases 3322 are fixedly connected to the two ends 222 of the second sheet 22.

As illustrated in FIG. 4, the bendable member 33 defines at least one groove 332. The two ends 222 of the second sheet 22 are connected to the bendable member 33 by filling the groove 332a with an adhesive portion. That is, at least one adhesive portion is disposed within the at least one groove 332a, and the at least one adhesive portion is used to connect the two ends of the second steel sheet 22 with the bendable member 33. In an implementation, each slider 332 define one row of grooves 332a. The one row of grooves 332a includes four grooves 332a spaced apart from each other along the first direction Y. By means of filling the groove 332a with the adhesive portion, when the second sheet 22 is attached to the bendable member 33, a portion of each end 222 of the second sheet 22 aligned with the groove 332a is bonded to the slider 332 via the adhesive portion, and thus the two ends 222 of the second sheet 22 are respectively fixed to the two sliders 332, and the two ends 222 of the second sheet 22 can drive the two sliders 332 to slide. In an implementation, the groove 332a is a strip-shaped groove extending along the first direction Y.

Furthermore, as illustrated in FIG. 4, the two ends 222 of the second sheet 22 each define at least one hollow portion 222a. Each groove 332a is defined at a position of the bendable member 33 aligned with one hollow portion 222a. The two ends 222 of the second sheet 22 are connected to the bendable member 33 by filling the at least one hollow portion 222a with an adhesive portion. That is, at least one adhesive portion is disposed within the at least one hollow portion 332a, and the at least one adhesive portion is used to connect the two ends of the second steel sheet 22 with the bendable member 33. In an implementation, the two ends 222 of the second sheet 22 each define the at least one hollow portion 222a corresponding to the at least one groove 332a. The hollow portion 222a is a strip hole. During assembly, the second sheet 22 is disposed on the bendable member 33 and each hollow portion 222a is in communication with one groove 332a of the slider 332. Then the adhesive portion is filled from one hollow portion 222a into one groove 332a of the slider 332, and thus the hollow portion 222a of the second sheet 22 and the groove 332a of the slider 332 are connected integrally with the adhesive portion, thereby further improving the reliability of the connection between the two ends 222 of the second sheet 22 and the two sliders 332.

Figure 8:
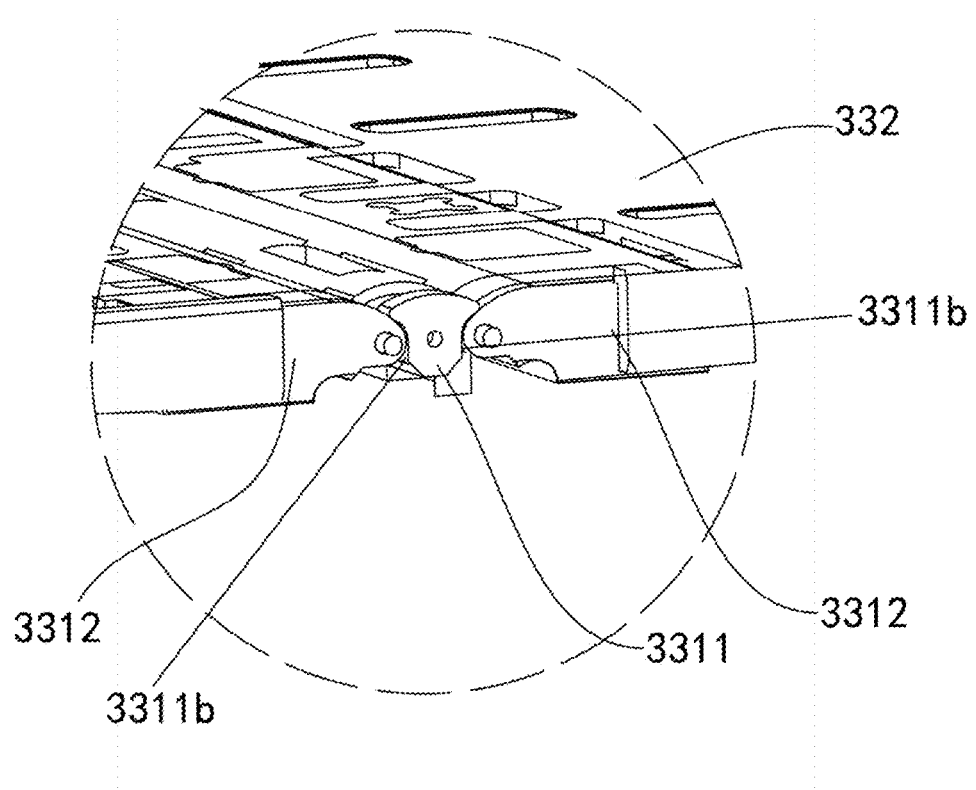
FIG. 8 is a partial, perspective view of a portion VIII of the bendable device illustrated in FIG. 2.

In an implementation, as illustrated in FIG. 8, the first hinge unit 3311 defines two notches 3311b respectively at the two sides of the first hinge unit 3311. s of the second hinge units 3312 facing the first hinge unit 3311 are received in the notch 3311b and connected to the first hinge unit 3311 via rotatable shafts. During bending the bendable device 100 from an unfolded state to a folded state having a first angle, a portion of the second hinge unit 3312 in the notch 3311b is gradually rotated outwardly, such that a bent outer surface of the hinge assembly 331 is gradually elongated. The slider 332 is disposed at one side of the second hinge unit 3312, during bending the bendable device 100 from the unfolded state to the folded state having the first angle, a distance between the slider 332 and the second hinge unit 3312 is gradually reduced. In an implementation, the first hinge unit 3311 includes two ends along the first direction Y. The two ends of the first hinge unit 3311 each can be defined as a rotation base, and the rotation base defines the two notches 3311b arranged symmetrically about a central axis of the rotation base. The second hinge unit 3312 is rotatably connected to a side of the rotation base via a rotating shaft, and the rotating shaft is positioned within the notch 3311b of the rotation base. In other words, the end of the second hinge unit 3312 extends into the notch 3311b of the rotation base and is rotatably connected with the rotation base. During that the bendable device 100 switches from the unfolded state to the folded state, the end of the second hinge unit 3312 is gradually rotated out of the first hinge unit 3311. In this process, since the slider 332 of the bendable member 33 is fixedly connected to the end 222 of the second sheet 22, the slider 332 slides in the direction toward the first hinge unit 3311 due to the end 222 of the second sheet 22, such that the bent side of the bendable member 33 matches the second sheet 22 in length, thereby preventing the flexible screen from being stretched or contracted.

When assembling the bendable device 100 in the implementations of the present disclosure, the two first sheets 21 are first detachably connected to the first housing 31 and the second housing 32, respectively, the middle section 221 of the second sheet 22 is then fixedly connected to the hinge assembly 331, and the two ends 222 of the second sheet 22 are fixedly connected to the two sliders 332. And then, the flexible screen 1 is stacked on the supporting sheet assembly 2.

The entire flexible screen 1 is connected to the supporting sheet assembly 2, such that when disassembling the bendable device 100, only the supporting sheet assembly 2 needs to be disassembled from the housing, thereby improving reliability of disassembly.

Finally, it is noted that the above implementations are merely used to illustrate rather than limit the technical solutions of the present disclosure. Although the present disclosure has been described in detail with reference to the foregoing implementations, those of ordinary skill in the art should understand the following. The protection scope of the present disclosure is not limited thereto. Within the technical scope disclosed in the present disclosure, various equivalent modifications or substitutions shall be readily appreciated by those skilled in the art and within the protection scope of the present disclosure. Therefore, the protection scope of the present disclosure shall be subject to the protection scope of the claims.

What is claimed is:

1. A bendable device comprising:
    a bendable flexible screen, wherein the flexible screen comprises a display surface and a rear surface opposite to the display surface;
    a housing assembly;
    a supporting sheet assembly sandwiched between the rear surface of the flexible screen and the housing assembly, wherein
    the flexible screen is connected to the housing assembly via the supporting sheet assembly,
    the supporting sheet assembly comprises a first sheet and a second sheet adjacent to the first sheet,
    the second sheet comprises a middle section and two ends respectively disposed at two opposite sides of the middle section, wherein the two ends are respectively close to edges of the second sheet, and a plurality of first stud portions protrude from a side of the middle section facing a bendable member of the housing assembly,
    the bendable member defines a plurality of stud grooves aligned with the plurality of first stud portions, wherein the plurality of first stud portions are respectively received in the plurality of stud grooves,
    at least one of the two ends of the second sheet is detachably connected with an end of the bendable member,
    each of the plurality of first stud portions comprises a first fixed stud corresponding to a central position of the bendable member and two first sliding studs respectively disposed at two sides of the first fixed stud,
    each of the plurality of stud grooves comprises a first stud groove disposed at the central position of the bendable member and two second stud grooves respectively disposed at two sides of the first stud groove, wherein the first fixed stud is fixed in the first stud groove, and the first sliding stud is slidable in the second stud groove,
    the first stud groove matches the first fixed stud in width to enable the first fixed stud to be fixedly connected, and
    the second stud groove has a larger width than the first sliding stud to enable the first sliding stud to be slidably connected in the second stud groove.

2. The bendable device of claim 1, wherein the first sheet is rigid or bendable, the second sheet is flexible, and a portion of the flexible screen aligned with the second sheet is bendable.

3. The bendable device of claim 2, wherein
    the housing assembly comprises a first housing and a second housing,
    the bendable member is connected between the first housing and the second housing, and
    the first sheet is detachably connected to one of the first housing and the second housing.

4. The bendable device of claim 3, wherein the first sheet is connected to one of the first housing and the second housing via screws.

5. The bendable device of claim 4, wherein
    at least one second stud protrudes from the first sheet;
    the first housing defines at least one second connection through hole corresponding to the at least one second stud; and
    at least one screw passes through the at least one second connecting through hole from a side of the housing assembly away from the second sheet and is fixedly locked to the at least one second stud.

6. The bendable device of claim 5, wherein two rows of second studs are respectively disposed at edges of the housing assembly.

7. The bendable device of claim 3, wherein the second sheet is connected to the bendable member via screws.

8. The bendable device of claim 3, wherein
    an adhesive layer is disposed between a part of the first sheet and one of a part of the first housing or a part of the second housing, such that the first sheet is bonded to the first housing or the second housing.

9. The bendable device of claim 2, wherein an adhesive layer is disposed between the first sheet and the flexible screen, such that the flexible screen is bonded to the first sheet.

10. The bendable device of claim 9, wherein the adhesive layer is a double-sided adhesive layer.

11. The bendable device of claim 2, wherein an adhesive layer is disposed between a part of the second sheet and a part of the flexible screen, such that the flexible screen is bonded to the second sheet.

12. The bendable device of claim 1, wherein the bendable member defines at least one groove, wherein at least one adhesive portion is disposed within the at least one groove, and wherein the at least one adhesive portion is used to connect at least one of the two ends of the second steel sheet with the bendable member.

13. The bendable device of claim 12, wherein the two ends of the second sheet each define at least one hollow portion, wherein the at least one groove is defined at positions of the bendable member aligned with the at least one hollow portion; and at least one adhesive portion is disposed within the at least one hollow portion, and wherein the at least one adhesive portion is used to connect at least one of the two ends of the second steel sheet with the bendable member.

14. The bendable device of claim 13, wherein the bendable member comprises a hinge assembly and two sliders arranged at two sides of the hinge assembly, wherein the hinge assembly comprises a first hinge unit and two second hinge units, wherein the first hinge unit defines a first connection through hole aligned with the first fixed stud, wherein a screw passes through the first connection through hole from a side of the first hinge unit away from the second sheet and is locked to one of the plurality of first stud portions; and the two sliders each defines at least one groove aligned with the at least one hollow portion, such that the two sliders are fixedly connected to the two ends of the second sheet.

15. The bendable device of claim 14, wherein the first hinge unit defines two notches at two sides of the first hinge unit;

ends of the two second hinge units facing the first hinge unit are received in the two notches and connected to the first hinge unit via rotatable shafts;

a portion of each of the two second hinge units in one of the two notches is gradually rotated outwardly during that the bendable device switches from an unfolded state to a folded state having a first angle, such that a bent outer surface of the hinge assembly is gradually elongated; and the two sliders are respectively disposed at sides of the second hinge units, and a distance between each of the two sliders and each of the two second hinge units is gradually reduced during the bendable device switches from the unfolded state to the folded state having the first angle.

16. A bendable device, comprising a flexible screen, a supporting sheet assembly, and a housing assembly, wherein the flexible screen, the supporting sheet assembly, and the housing assembly are stacked in sequence, the flexible screen is connected with and cooperates with the supporting sheet assembly to form a display assembly, and the display assembly is detachably connected to the housing assembly, the supporting sheet assembly comprises a first sheet and a second sheet adjacent to the first sheet, the second sheet comprises a middle section and two ends respectively disposed at two opposite sides of the middle section, wherein the two ends are respectively close to edges of the second sheet, and a plurality of first stud portions protrude from a side of the middle section facing a bendable member of the housing assembly, the bendable member defines a plurality of stud grooves aligned with the plurality of first stud portions, wherein the plurality of first stud portions are respectively received in the plurality of stud grooves, at least one of the two ends of the second sheet is detachably connected with an end of the bendable member, each of the plurality of first stud portions comprises a first fixed stud corresponding to a central position of the bendable member and two first sliding studs respectively disposed at two sides of the first fixed stud, each of the plurality of stud groove comprises a first stud groove disposed at the central position of the bendable member and two second stud grooves respectively disposed at two sides of the first stud groove, wherein the first fixed stud is fixed in the first stud groove, and the first sliding stud is slidable in the second stud groove, the first stud groove matches the first fixed stud in width to enable the first fixed stud to be fixedly connected, and the second stud groove has a larger width than the first sliding stud to enable the first sliding stud to be slidably connected in the second stud groove.

17. The bendable device of claim 16, wherein first sheet includes two first sheets;

the second sheet is connected between the two first sheets;

the housing assembly comprises a first housing and a second housing;

the bendable member is connected between the first housing and the second housing;

the two first sheets are respectively detachably connected to the first housing and the second housing; and the second sheet is detachably connected to the bendable member.

18. The bendable device of claim 17, wherein the bendable member comprises a hinge assembly and two sliders arranged at two sides of the hinge assembly, and wherein the two sliders are respectively slidably connected to the hinge assembly.

* * * * *